United States Patent
Fernandez et al.

(10) Patent No.: US 7,148,828 B2
(45) Date of Patent: Dec. 12, 2006

(54) SYSTEM AND METHOD FOR TIMING CALIBRATION OF TIME-INTERLEAVED DATA CONVERTERS

(75) Inventors: Andrew D. Fernandez, Palo Alto, CA (US); Vamsi K. Srikantam, Fremont, CA (US); Robert M. R. Neff, Palo Alto, CA (US); Kenneth D. Poulton, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 72 days.

(21) Appl. No.: 11/120,698

(22) Filed: May 3, 2005

(65) Prior Publication Data

US 2006/0250288 A1 Nov. 9, 2006

(51) Int. Cl.
*H03M 1/10* (2006.01)
(52) U.S. Cl. .................................................. 341/120

(58) Field of Classification Search ............... 341/118, 341/119, 120, 121, 123, 122, 155
See application file for complete search history.

(56) References Cited

U.S. PATENT DOCUMENTS

| 4,736,189 A | * | 4/1988 | Katsumata et al. ......... 341/120 |
| 4,962,380 A | * | 10/1990 | Meadows .................... 341/120 |
| 6,407,685 B1 | * | 6/2002 | Handel et al. ............... 341/120 |

* cited by examiner

*Primary Examiner*—Brian Young (57) ABSTRACT

A method for calibrating time interleaved samplers comprising applying a calibration signal to a time-interleaved sampling device, wherein the signal is coherent with at least one sample clock on the device and is periodic and has a predetermined spectral content and frequency, sampling, by said time-interleaved sampling device, the calibration signal at a plurality of phases to form samples, averaging the formed samples, and calculating the phase error of each sample based on the average calibration signal sample.

22 Claims, 5 Drawing Sheets

SYSTEM AND METHOD FOR TIMING CALIBRATION OF TIME-INTERLEAVED DATA CONVERTERS

BACKGROUND OF THE INVENTION

All digital systems that interact with the real world must convert continuous analog signals into a discrete representation and/or convert those discrete representations back into continuous signals. Devices that bridge the gap between the analog and digital world are known as data converters. Not surprisingly, digital-to-analog converters (DACs) and analog-to-digital converters (ADCs) are employed in a wide variety of applications including telecommuncations, medical imaging, consumer electronics, and general purpose measurement. Systems comprising DAC and ADC components can be characterized by their sampling rate, which is a measurement of how frequently the system converts an analog voltage to a digital sample or a digital sample to an analog voltage. The capacity or bandwidth of systems analyzing incoming analog waveforms is limited by the sampling rates of component ADCs.

A current approach to increase the overall sampling rate of a data conversion system is to interleave multiple ADCs or DACs. Such systems interleave M individual sampling slices of sample rate $f_s$, to yield a converter with an aggregate sample rate of M multiplied by $f_s$. This technique is used to increase the bandwidth of both monolithic data converters that interleave more than one sampling slice and data conversion systems that interleave more than one data conversion chip. Interleaving is employed in several ADCs today such as, for example, Agilent Technologies, Inc.'s 4 GSa/s and 20 GSa/s data converters. As of 2003, Agilent has designed ADCs incorporating up to 80 separate sampling slices running at an aggregate rate of 20 Gigasamples/ second (GSa/s).

While interleaving components such as ADCs or DACs is a powerful technique for increasing the maximum sampling rate of a signal processing system, the performance of interleaved converters is limited by offset and gain mismatches as well as by timing errors between interleaved slices. The calibration of both voltage and sample clock timing is critical to increasing the maximum sample rate without significantly degrading accuracy. In general, it is sufficient to align the fastest slewing signal when interleaving to within ½ of a least significant bit (LSB). For oscilloscope applications, timing errors must be less than 0.4% of the period of the fastest input signal. One method for calibrating highly interleaved converter systems applies an external signal, captures that signal in memory, and then processes that signal to determine the relative time offsets of the sampling slices. There are two general correction approaches once the timing offset errors are known. One approach builds on-chip time delay circuits that fine-tune sample clocks to remove measured time offsets. The other approach digitally corrects for sampling time errors by interpolating the captured samples to yield an estimate of sampled data. Conventional implementations of the time offset measurement required for either method require significant amounts of on-board or on-chip high-speed memory. Significant memory requirements impact the physical size and cost of manufacturing a data conversion system.

During a typical foreground calibration, a test signal is switched in to apply a dedicated calibration signal to the converter system. The entire response for some time interval is captured in memory present on or external to the data converter. The response to the calibration signal source is then transformed into the frequency domain to compute per slice time offset. Prior calibration signals include periodic signals (sinusoids, square waves) or non-periodic (ramps). One conventional approach to time offset measurement follows:

1. Apply sinusoid of frequency F, where the sinusoid is not phase locked to the converter clock;
2. Capture N multiplied by M consecutive samples of the ADC response, where M is the number of slices in the interleaved converter and N is the number of samples desired per slice;
3. De-interleave the time record into M separate records of N samples each;
4. Perform a fast Fourier transform (FFT) on each of the M records;
5. Find the phase of the FFT bin nearest to the stimulus sinusoid of frequency F;
6. Compare the phases found from each of the M slices to determine the relative phase offset of each slice; and
7. Convert phase offset into time offset using the calibration signal frequency and converter sample rate.

Three specific implementations of foreground calibration are described in U.S. Pat. No. 5,294,926 to Corcoran, entitled "Timing and amplitude error estimation for time-interleaved analog-to-digital converters," U.S. Pat. No. 4,763,105 to Jenq, entitled "Interleaved digitizer array with calibrated sample timing," and U.S. Pat. No. 6,269,317 to Schachner et al. entitled "Self-calibration of an oscilloscope using a square-wave test signal," the disclosures of which are herein incorporated by reference. Methods incorporating background calibration allow the converter to operate normally and the converter auto-calibrates on its own signal.

In the process of calibration, long capture records are required to average out uncorrelated noise sources, thereby improving measurement accuracy. Unfortunately, long capture records demand more high speed sample storage, such as high speed RAM, and sample storage is limited in high-speed ADCs. Off-chip methods for timing calibration that use memory external to a data converter tend to be more computationally complex and necessarily much slower. A direct implementation of these off-chip methods for on-chip calibration is inefficient and computationally intensive.

Lastly, although few data converters have on-chip timing calibration systems, some already incorporate timing adjustment circuits. A remaining hurdle in implementing on-chip timing calibration is determining those timing adjustments to be made by the timing adjustment circuits.

BRIEF SUMMARY OF THE INVENTION

Certain embodiments of the present invention are directed to methods for calibration comprising applying a calibration signal to a time-interleaved sampling device, wherein the signal is coherent with at least one sample clock on the device and is periodic, sampling the calibration signal at a plurality of phases, averaging the calibration signal samples at each phase, and calculating the phase error of each sample based on the average calibration signal sample at each phase. Examples of devices that can be calibrated according to embodiments of the present invention are interleaved devices such as ADCs and DACs that are used in applications such as time-of-flight mass spectrometry, military applications, software radio applications, oscilloscopes, precision time measurement, and other uses.

Other embodiments of the invention comprise methods in which coherent averaging of a periodic waveform is used to estimate the relative time delay of data converter sampling slices. This method requires minimal hardware modifications to the present converter architecture. A separate calibration controller uses these relative time delay estimates to iteratively adjust the clocking of each sampling slice. On-chip calibration for a complex interleaved data converter such as, for example, Agilent Technologies Inc.'s 20 GSa/s ADC, reduces the software support it requires. Built-in calibration according to embodiments of the present invention have the added advantage of reduced test time thereby reducing test cost and reduced calibration time in the end application.

Certain embodiments of the invention apply a calibration signal to a data converter to be calibrated. The calibration signal frequency has a defined ratio to the sample clock frequency on the converter to be calibrated; it is phase locked to a sample clock signal. In some embodiments, the calibration signal is not required to be perfectly locked to the converter's sample clock (see cycle slip). Using a calibration frequency that is related to the sample clock signal in certain embodiments minimizes the amount of sample storage required to calibrate the data converter.

Other embodiments of the present invention can be used to calibrate converters on separate instruments. Applications which require that the instruments be interleaved or time-synchronized can be performed more accurately following the calibration of the data converters according to certain embodiments of the present invention.

Yet other embodiments of the invention determine the frequency response of a time-interleaved system to a calibration signal by analyzing data obtained by the time-interleaved data converters. The data analyzed in certain embodiments of the invention are discrete samples taken at separate time points. These embodiments look at the phase and amplitude of as many samples that are present in the periodic waveform of the calibration signal. A discrete Fourier transform applied to the per-slice averaged calibration waveform yields the frequency response of the individual slice.

The foregoing has outlined rather broadly the features of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

As described above, the speed and bandwidth of a data conversion system can be enhanced by using multiple interleaved converters. Highly interleaved data converters are in demand for applications such as time-of-flight mass spectrometry, military applications, software radio applications, oscilloscopes, precision time measurements, and other uses. The performance of interleaved devices relies on the interleaved units behaving uniformly and capturing/generating equally spaced samples. Timing information is provided by a clock and ensures that each interleaved component performs its function, such as a signal sampling function, at precisely the right moment. In the case of interleaved ADCs and DACs, multiple sampling clocks are used to time the sampling of each individual component. Timing calibration of interleaved devices is required for optimum accuracy.

Many present timing calibration approaches are performed offline in the software of a supporting microprocessor. These approaches require a large capture memory operating at the sampling rate, and the data record size and timing resolution are limited by the capture memory, which is costly to implement from a performance and manufacturing perspective. Present software-based timing calibration takes approximately 11 seconds to complete and presents an inconvenience to the user. Embodiments of the invention described below are much faster and do not inconvenience the user. These embodiments require less on-chip capture memory, and therefore cost less and can be physically smaller in size.

Certain embodiments of the present invention are systems and methods for foreground calibration of interleaved devices. As such, the embodiments have a calibration mode that is separate from the normal operating mode. During the calibration mode, conversion of the input is halted while a dedicated calibration signal is applied. Certain embodiments of the invention will be described as pertaining to time-interleaved ADCs. However, the embodiments are easily extended to calibrate time-interleaved DACs. Yet other embodiments pertain to interleaved ADC and DAC instrument modules. In addition, certain embodiments of the invention can align ADC and DAC slices or instrument modules to have the same timing, rather than interleaved timing.

Figure 1:
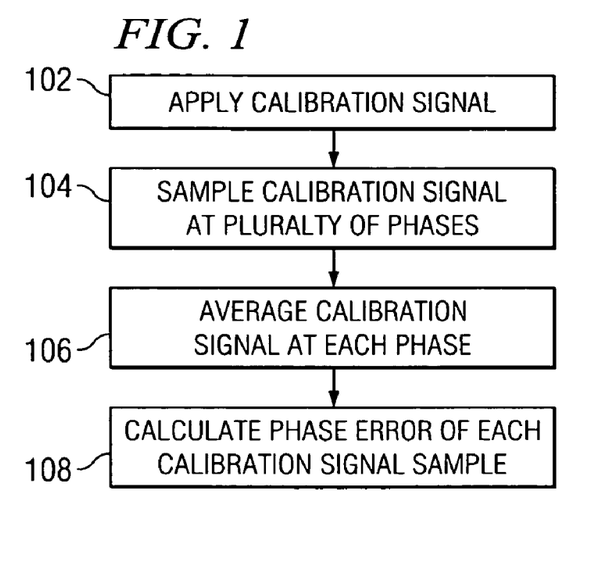
FIG. 1 shows a method of calibrating a device according to an embodiment of the present invention.

FIG. 1 shows a method of calibrating an interleaved sampling device according to an embodiment of the present invention. Embodiments of the present invention can also be used to calibrate data converters residing on separate instruments that are used together. In process 102, a signal is applied to or received by the device being calibrated. In preferred embodiments, a calibration signal is applied to a time-interleaved sampling device such as an analog-to-digital converter (ADC), digital-to-analog converter (DAC), and/or combinations of these devices. Also, the applied calibration signal is periodic, and rationally related to at least one sample clock on the device. Such periodic signals include sinusoids, square waves, and triangle waves. The primary requirement of the calibration signal is that it repeats and has a period with a fixed relationship to the sampling rate of the device. Secondary requirements improve the calibration accuracy. These include minor frequency offsets (called cycle slip, to be discussed later) and bandwidth limitations (to prevent aliasing spectral components from behaving like correlated noise sources). Fast slewing signals are ideal as calibration signals because timing errors are easiest to resolve when the amplitude of the signal is changing rapidly and adjacent measurements of the signal accordingly have greater differences.

An on-chip timing calibration approach according to certain embodiments of the present invention employs a periodic calibration signal that is coherent with a sample clock on a converter being calibrated. A coherent calibration signal is one that is phase-locked to a reference time base. The calibration signal does not have to be exactly locked, but can be slightly off-frequency (allowable error to be quantified later). Such a calibration signal is guaranteed to repeat with some relationship to the ADC clock, thus enabling hardware averaging of periodic calibration waveforms. Hardware averaging greatly reduces uncorrelated noise without increasing on-chip capture memory. The averaged time records may then be processed to determine the phase relationship of the various sample clocks. Additionally, it is possible to average the results of successive phase measurements instead of or in addition to averaging time records.

In process 104, the calibration signal applied to the device is sampled at a plurality of phases. The amount of data collected and the number of samples may vary. In a preferred embodiment, 80 sampling slices of a calibration signal are taken.

In process 106, the sampled calibration signals taken at each phase are averaged. For example, a capture buffer that corresponds to clock phases $0, \pi/2, \pi, 3\pi/2$, etc. are averaged together with other sample capture buffers from the same clock phase.

In process 108, the phase error of each sample is calculated based on the average calibration signal at each phase. The phase error of each sample represents the difference between a desired temporal separation of the signal sample from the previous signal sample adjusted for the phase at which the sample was taken. In certain embodiments of the invention, the phase error is calculated by unwrapping phase error from the averaged signals and finding mean phase offset. The mean phase offset is then subtracted from the phase error for each sample to produce a phase error for that sample.

In certain embodiments of the invention, the calculated phase error is used to adjust a timing circuit. The phase error can be used in the form produced in process 108, or can be converted, for example, to coefficients or multipliers for use with a timing modification system. In other embodiments, the calculated phase error may be used to control sample correction by digital filtering, either in hardware or software. In yet other embodiments of the invention, the process shown in FIG. 1 and described above can be used to generate a frequency response calibration curve. The procedure may be used to create a frequency response for each phase. As an example, the DFT of the averaged signal from 106 is an estimate of the frequency response for that phase. (If the goal is to determine the frequency response, a periodic calibration signal with more spectral components may be desired.) The frequency response numbers are used in certain embodiments to modify frequency response characteristics of the device being calibrated.

Figure 2:
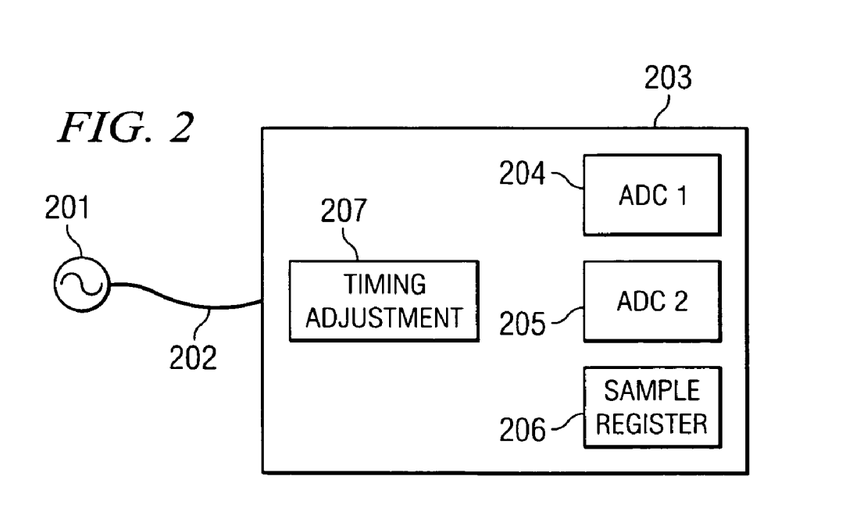
FIG. 2 shows a block diagram of a system for measuring the time offsets of multiple DACs and using coherent timing calibration to calibrate the multiple DACs according to an embodiment of the present invention.

FIG. 2 is a block diagram of an exemplary system for calibrating a signal digitizer according to an embodiment of the present invention. The system comprises a waveform generator 201 connected to the digitizer 203 via a transmission means 202 (e.g., a cable or other suitable transmission means). Waveform generator 201 outputs a calibration signal to digitizer 203. In this embodiment, the digitizer 203 is comprised of a first ADC (ADC1) 204 and a second ADC (ADC2) 205 which are time-interleaved. In other embodiments, other components such as DACs are used. Different numbers of time-interleaved components (e.g. ADCs) may be included in embodiments of the present invention, and thus embodiments are not limited to the example of FIG. 2 that includes two such time-interleaved components. An ADC's sample clock dictates which sample clocks for ADC1 and ADC2 are provided by a clock unit, which may contain circuits to adjust the phase of one clock relative to the other. Thus, the signal applied by waveform generator 201 provides a reference signal, and each ADC performs its respective action at a different time relative to that reference signal. The samples are stored and averaged in sample register 206. This invention allows the signal to be averaged and stored, reducing memory requirements. In other embodiments, sample register 206 is present in other locations, such as on-board ADC1 204 and/or ADC2 205. The sample register 206 contains two averaged buffers. The first buffer contains ADC1's samples and consists of one period of the periodic waveform (averaged over the course of the acquisition). The second buffer contains ADC2's samples and consists of one period of the calibration waveform (averaged over the course of the acquisition). The phase error of the signal contained in the averaged buffers from sample register 206 is used to determine appropriate adjustment to be made via vernier circuits in timing adjustment circuitry 207. In other embodiments of the invention, additional features of the invention are present. For example, more than one digitizer module 203 can be connected to waveform generator 201 in other embodiments, and data conversion modules can be time-interleaved as described below in FIG. 8.

Figure 3:
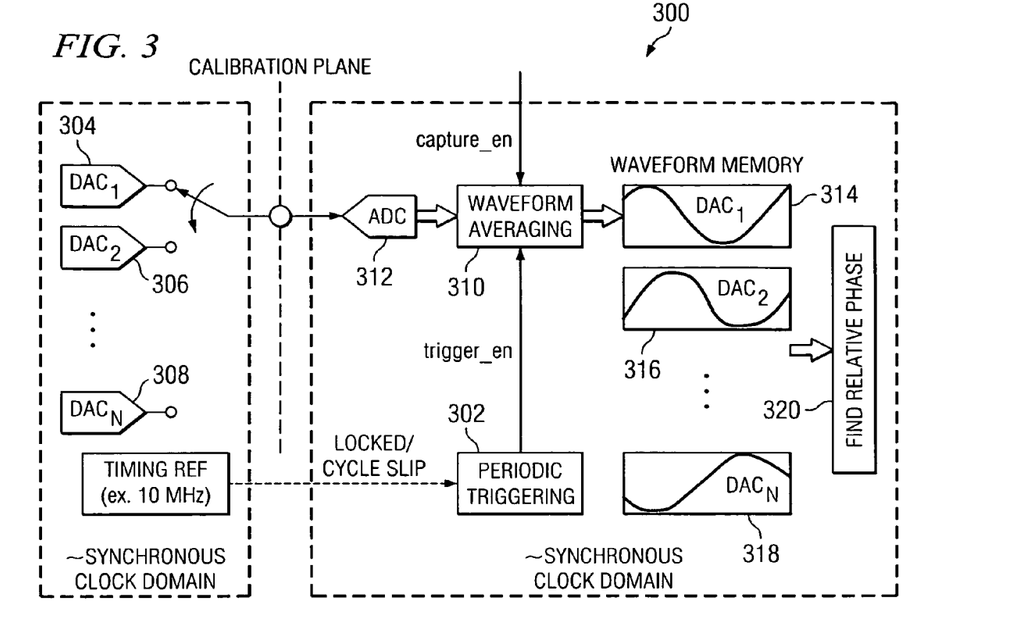
FIG. 3 is a block diagram of a system according to an embodiment of the present invention that measures the time offset between a pair of ADCs and calibrates out time offsets.

FIG. 3 shows a block diagram of an exemplary system for measuring the time offsets of multiple data converters and using coherent timing calibration to calibrate multiple data converters according to an embodiment of the present invention. This system 300 measures the relative phase of each data converter's sample clock. This embodiment of the invention relies upon a periodic trigger 302 that is shared between the clock domain of multiple DACs to be time synchronized ($DAC_1$, 304, $DAC_2$ 306, and $DAC_N$ 308) and the clock domain of the ADC 312. Note that both ADC 812 and DACs (304, 306, 308) share approximately the same clock domain. The two clock domains may be locked together, or slightly offset to incorporate cycle slip. A periodic trigger signal 302 is generated at the start of each period of the DACs (304, 306, 308) repetitive waveform. The waveform memory (314, 316, 318) of the ADC 312 contains the average of multiple records triggered by the periodic trigger signal. This averaged waveform memory (314, 316, 318) from waveform averaging 310 is a snapshot of the selected DACs (304, 306, 308) output at the calibration plane.

The waveform capture is disabled when switching the signal path to a subsequent DAC. When the second DAC is selected, the user may re-enable waveform averaging to calculate the phase of the second DAC. Note that the periodic trigger generation continues unimpeded through the entire process. This second waveform will appear shifted due to phase differences between the clock of $DAC_1$ 304 and the clock of $DAC_2$ 306. Repeat the process to capture results from all DACs to be synchronized. Finally, with knowledge of all the captured DAC waveforms relative to a single calibration plane, it is possible to find the relative phase 320 of each DAC's clock. Aliasing, averaging, hardware averaging, and cycle slip may all be employed to further improve the measurement. If the sampling rate of the DACs is greater than that of the ADC, the DAC signal can be downconverted before sampling by the ADC. If the ADC input bandwidth allows, undersampling of the DAC output can be used as an alternative.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. While the following examples refer to specific devices, other devices such as, for example, DACs and other data converters are used in other embodiments of the present invention that incorporate the exemplary material.

I. General Application

Figure 4:
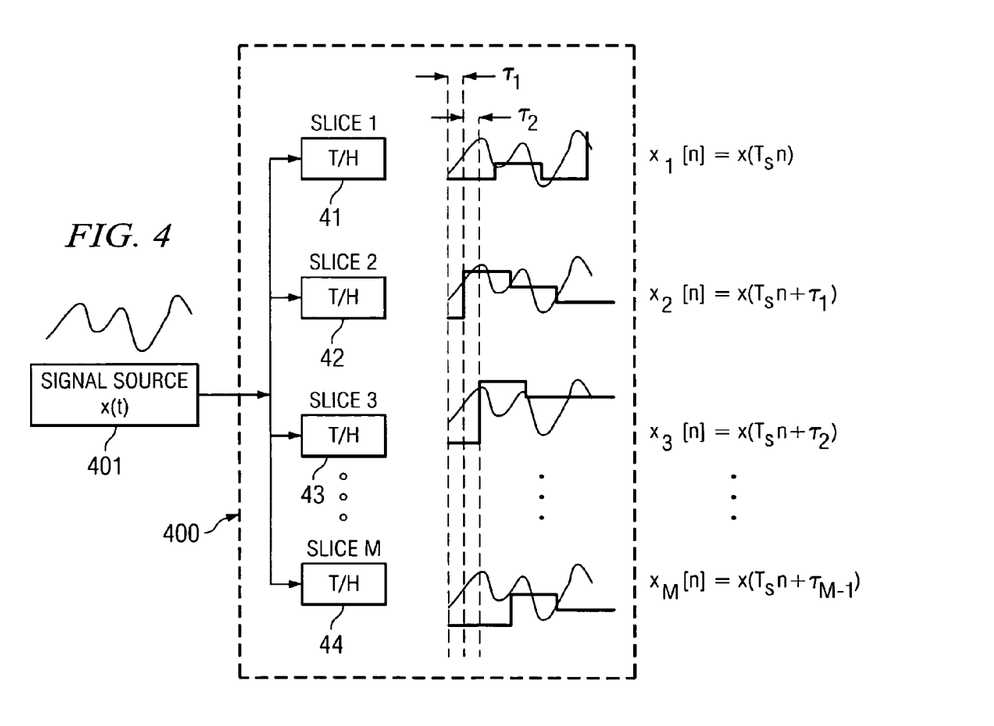
FIG. 4 is an illustration of the operation of an interleaved ADC.

FIG. 4 illustrates the operation of an interleaved ADC 400. Timing calibration proceeds by applying a calibration signal (not shown) such as, for example, a sine wave to the ADC. In general, any periodic calibration signal may be chosen. Such signals include sinusoids, square waves, and triangle waves. The primary requirement of the calibration signal is that it repeats and has a period with a fixed relationship to the sampling rate of the device. Secondary requirements improve the calibration accuracy. These include minor frequency offsets (a cycle slip of <⅛ over the acquisition) and bandwidth limitations (to prevent aliasing spectral components from behaving like correlated noise sources). Due to the different phases of the sampling clocks for each of the interleaved ADC units that make up the exemplary ADC 400 of FIG. 4, each successive ADC slice sampled by ADCs 41–44 (Slice 1, Slice 2, . . . Slice M) represents a waveform portion of the input waveform provided by signal source 401 delayed by a time period. This example calculates the delay between each of the successive stored waveforms for each ADC slice. The data captured by each ADC slice is examined and used to determine the degree to which the waveforms are delayed between slices. In an ideal ADC, this delay, $\tau_m$, should be exactly equal to the aggregate sampling period, $1/(Mf_s)$. If the delay between slices is not $1/(Mf_s)$, the on-chip sample clocks for the ADCs are skewed to remedy the measured timing error. The process repeats until the timing errors are below acceptable levels. The notation above references all sample clock phases to the slice 1 sample clock. In other embodiments of the invention, other sample clock phases are referenced. $T_s$ is the sample period of an individual ADC slice sample clock of frequency $f_s$.

The on-chip timing calibration approach used in this embodiment of the invention employs a periodic calibration signal that is coherent with the ADC sample clock. A coherent signal is one that is frequency- and phase-locked to a reference time base. Such a signal should repeat with some relationship to the ADC clock, which enables hardware averaging of periodic calibration waveforms. Hardware averaging has the advantage of greatly reducing uncorrelated noise without increasing in on-chip capture memory. The averaged time records may then be processed to determine the phase relationship of the various sample clocks. It is possible to average the results of successive phase measurements instead of, or in addition to, averaging time records.

A sine wave is chosen as the calibration signal for discussion of the remainder of this example for two reasons. First, it is relatively straightforward to synthesize fast-slewing sine waves. Second, it is computationally simple to determine the phase of a sinusoid. The frequency of the calibration sinusoid is chosen such that a unique waveform is present at each ADC slice. In more general notation, $f_{cal}=(f_s/P)(N)$ where $N \neq 0, \pm P, \pm 2P, \ldots$; where $f_s$ is the slice sampling frequency, M is the number of ADC slices, P is the number of samples per period, and N is a positive integer. If the fundamental frequency (DFT bin 1) is used to determine phase, then in general, $f_{cal}=(f_s/P)(PN\pm 1)$. It is also possible to choose a frequency from the time domain perspective. For an ADC with M slices, a periodic signal with period of P samples can be chosen such that M and P are mutually prime.

A periodic calibration signal enables time averaging to reduce uncorrelated noise. Periodic time averaging, on a per slice basis may be represented as:

$$x_{slice,avg}[i] = \frac{\sum_{j=0}^{N-1} x_1[i+jP]}{N}, \text{ where } i \text{ varies from 0 to } P\text{-1.} \quad [1]$$

The phase of the calibration signal seen at each slice is determined next and used to compute time delays. The phase determination is performed efficiently through correlation with sine and cosine (Equations [2] & [3] below). This procedure produces equivalent results to determining the phase of the fundamental frequency after computing a discrete Fourier transform (DFT) or fast Fourier transform (FFT), but is more efficient than performing a full DFT or FFT. This approach is resilient to voltage gain and offset differences between the M ADC slices, differences which can impact the magnitude and offset of the calibration signal as seen by each slice. However, these effects do not change the phase of the calibration signal, which is a desirable characteristic for timing calibration. Given $$I = \sum_{i=0}^{P-1} x_{avg}[i]\cos\left(\frac{2\pi i}{P}\right) \quad [2]$$

$$Q = \sum_{i=0}^{P-1} x_{avg}[i] \sin\left(\frac{2\pi i}{P}\right) \quad [3]$$

then the phase is computed as:

$$\angle X_{avg}[i] = \tan^{-1}\left(\frac{Q}{i}\right) \quad [4]$$

Phase measurement errors are dominated by uncorrelated noise sources and harmonics in the calibration signal. Periodic averaging addresses the effect of uncorrelated noise. Periodic averaging does not help remove the effects of correlated noise sources such as harmonics in the calibration signal. These harmonics may be introduced by the signal source itself, or may be generated within the ADC. As an example, imagine an 8-point DFT with the $7^{th}$ harmonic aliasing on top of the fundamental frequency. If the calibration signal is a sinusoid with a period of 8 samples, then computing its phase is equivalent to the determining the phase of the first bin in the DFT. Frequencies above 4 times the fundamental cannot be represented uniquely by the 8-point DFT as they alias back to the lower bins. In particular, the $7^{th}$ harmonic (HD7) of the fundamental aliases to fall at the fundamental frequency. The phase of the $7^{th}$ harmonic varies more rapidly with time delay than that of the fundamental. In this example, both the relative magnitude and phase of the $7^{th}$ harmonic are unknown. As a result, the unknown and varying phase contribution from harmonics reduces measurement accuracy for the phase of the fundamental. In fact, a whole series of harmonics alias back to the fundamental frequency, and may be represented as 8N±1 where N is a positive integer. Other harmonics are orthogonal and therefore don't impact phase measurement. This is particularly valuable because HD2 and HD3 are usually the dominant harmonics while the HD7 and HD9 are quite small.

Figure 5:
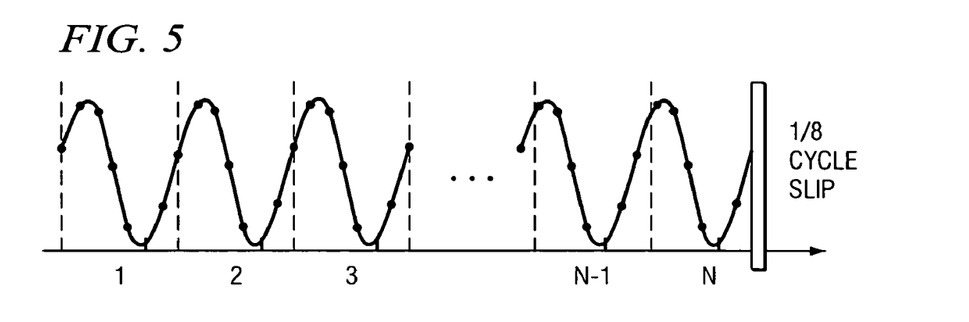
FIG. 5 is an illustration showing cycle slip as a small ⅛ cycle incremental to N cycles of periodic averaging.

To mitigate the effect of harmonics and ensure a robust calibration, cycle slip is introduced to the calibration signal. Cycle slip refers to a small frequency offset applied intentionally to a coherent calibration signal. In effect, this frequency offset introduces or removes a fraction of a cycle over the entire calibration signal acquisition interval of many periods. This is illustrated in FIG. 5, which shows cycle slip as a small ⅛ cycle incremental to N cycles of periodic averaging. Cycle slip allows the calibration approach to use the entire ADC transfer curve during phase measurement. In general, this approach is more resilient to point imperfections in the ADC transfer curve. If the ADC sample clocks were perfectly locked to an 8-point periodic calibration signal, then each period of the sinusoidal calibration signal would be sampled at exactly the same 8 points. Therefore, if the ADC transfer curve at one or more of those 8 points was abnormal, the resulting phase measurement would be skewed. Cycle slip overcomes this undesirable effect by applying a small frequency offset to the calibration frequency. After application of the frequency offset, the sampling instant of the 8 points in the example period changes slightly from the start of acquisition to the end. If this "slip" over the entire acquisition interval is ⅛ of a cycle or more, then the entire ADC transfer curve between $V_{max}$ and $V_{min}$ of the calibration signal is utilized. The optimum cycle slip is approximately 1/P cycle, where P is the number of samples per period. Additional cycle slip decreases the averaged signal amplitude. Less than 1/P cycle slip leaves portions of the ADC transfer function out of the averaging.

Cycle slip also provides a method for reducing the impact of harmonics on measurement. As an example of the benefits of cycle slip, the frequency response is evaluated of the filter created by taking the DFT of a time-averaged periodic waveform. In this example embodiment, the number of captured samples, N, is much larger than the desired number of spectral points. In this example, L averages of a signal with period P samples requires N=P*L captured samples. However, the only data of interest is the DFT of the captured data at one frequency (namely, in this example, the fundamental frequency). Following the analysis in chapter 6 of Rabiner and Gold (L. R. Rabiner and B. Gold, Theory and Application of Digital Signal Processing. Englewood Cliffs, N.J.: Prentice-Hall, 1975), the disclosure of which is hereinafter incorporated by reference, the averaging and correlation steps described above are represented as one filter. Note that the sign of k is inverted to align with the correlation ordering in [2] and [3], and that normalization by N due to averaging is included.

$$h[n] = \frac{e^{-j|2\pi(-k)n/N|}}{N}, \; 0 \leq n \leq N-1 \quad [5]$$

The Z transform of this filter is:

$$H(z) = \frac{1}{N} \sum_{n=0}^{N-1} e^{-j|2\pi(-k)n/N|} z^{-n} \quad [6]$$

$$H(z) = \frac{1}{N} \cdot \frac{1 - Z^{-N}}{1 - Z^{-1} Z^{j|2\pi(-k)n/N|} z^{-n}} \quad [7]$$

Evaluating equation [7] on the unit circle yields the following frequency domain representation:

$$H(e^{jw}) = \frac{1}{N} e^{jw|(N-1)/2|} e^{-j\pi k/N} \frac{\sin(N\bar{\omega}/2)}{\sin(\bar{\omega}/2 - \pi k/N)} \quad [8]$$

$$H(e^{jw}) = \frac{1}{PL} e^{jw|(PL-1)/2|} e^{-j\pi - i/P} \frac{\sin(PL\bar{\omega}/2)}{\sin(\bar{\omega}/2 - \pi \cdot i/P)}, \quad [9]$$

where $i = k/M$, and $i = 0, 1, \ldots, P-1$

Figure 6:
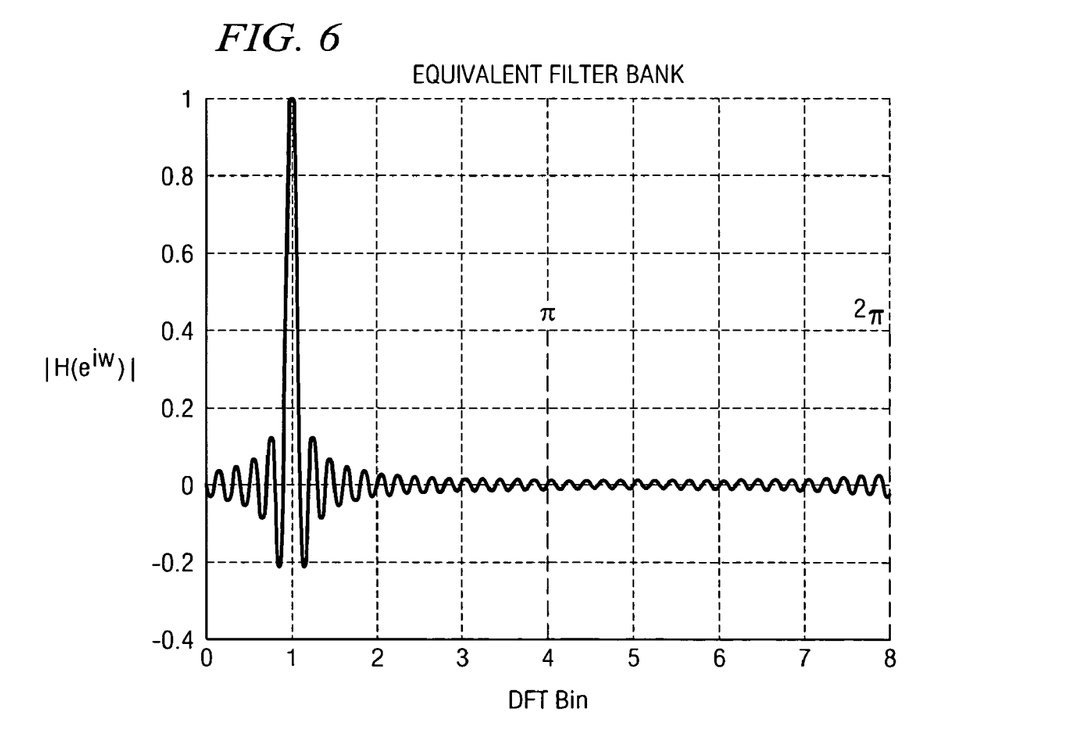
FIG. 6 is an illustration of a sample plot of the frequency response for a discrete Fourier transform according to an embodiment of the present invention.

In the 20 GSa/s data converter, discussed further below, an 8-sample sample period is averaged during the acquisition of a calibration signal. As the number of averages increases, the length of the equivalent DFT increases, but the response is calculated at one frequency. The plot in FIG. 6 illustrates a plot of the frequency response of the equivalent filter bank for the $1^{st}$ bin of the DFT considering P=8 samples, L=10 averages, and N=PL=80. This $1^{st}$ bin corresponds to i=1 in equation [10]. The plot shows the sensitivity of an averaged measurement to a sinusoidal calibration signal that is 'off-bin'. The expression below substitutes P=8 samples, L=10 averages, and N=PL=80 time steps into [9].

$$H(e^{jw}) = \frac{1}{80} e^{jw\lfloor(80-1)/2\rfloor} e^{-j\pi-i/8} \frac{\sin(80\bar{\omega}/2)}{\sin(\bar{\omega}/2 - \pi \cdot i/8)}, \quad [10]$$

where $i = 0, 1, \ldots, 7$

If the calibration signal is centered upon the $1^{st}$ DFT bin, its $7^{th}$ harmonic aliases on top of the fundamental frequency. A small frequency deviation corresponds to moving off-center-bin of the frequency response above. If the fundamental is not located exactly on-bin, then an aliased harmonic may be nulled. Notice that with a frequency offset of just ⅐ of a cycle over N data points, the aliasing $7^{th}$ harmonic now lies in a null of the DFT result. In effect, the aliasing harmonic is nulled. However, other aliasing harmonics such as HD9 are not necessarily nulled. Also, the HD2 to HD6 are no longer nulled.

2. 20 GSa/s Interleaved ADC

In this section, the generally applicable example described above is implemented in Agilent's 20 GSa/s data converter. In this example, a calibration signal, which is a sine wave in preferred embodiments, is applied to the 20 GSa/s interleaved ADC. Agilent's 20 GSa/s is a 20 GS/s, 8-bit ADC. It interleaves 80 slices, each with a sampling clock of 250 MHz for an aggregate 20 GHz sampling rate. An advantage of choosing P=8 registers is that the 8 point sine/cosine correlation is simple to implement. This is discussed in greater detail below. The choice of P=8 constrains the use of calibration frequencies of $f_{cal}=f_s*R\pm f_s/P=250$ MHz*R±250 MHz/P, where R is a positive integer.

Timing calibration parameters for this example are summarized below:

| | | |
|---|---|---|
| ADC slices | M | 80 slices |
| Sampling Clock Frequency | $f_s$ | 250 MHz |
| Hardware averaging registers | P | 8 registers |
| Number of time averages | L | 1500 averages (programmable) |
| Aggregate sampling rate | $F_s$ | 20 GHz = M*fs |
| Calibration waveform base frequency | $f_c$ | 250 MHz*R ± 250 MHz/8, R=0, 1, 2, ... |
| Cycle slip factor | $\theta_{slip}$ | 1/7 or 1/8 |
| Cycle slip frequency offset | $\Delta f_c$ | $\theta_{slip}/(N* 1/F_s)$, where N = P*M*L |

Figure 7:
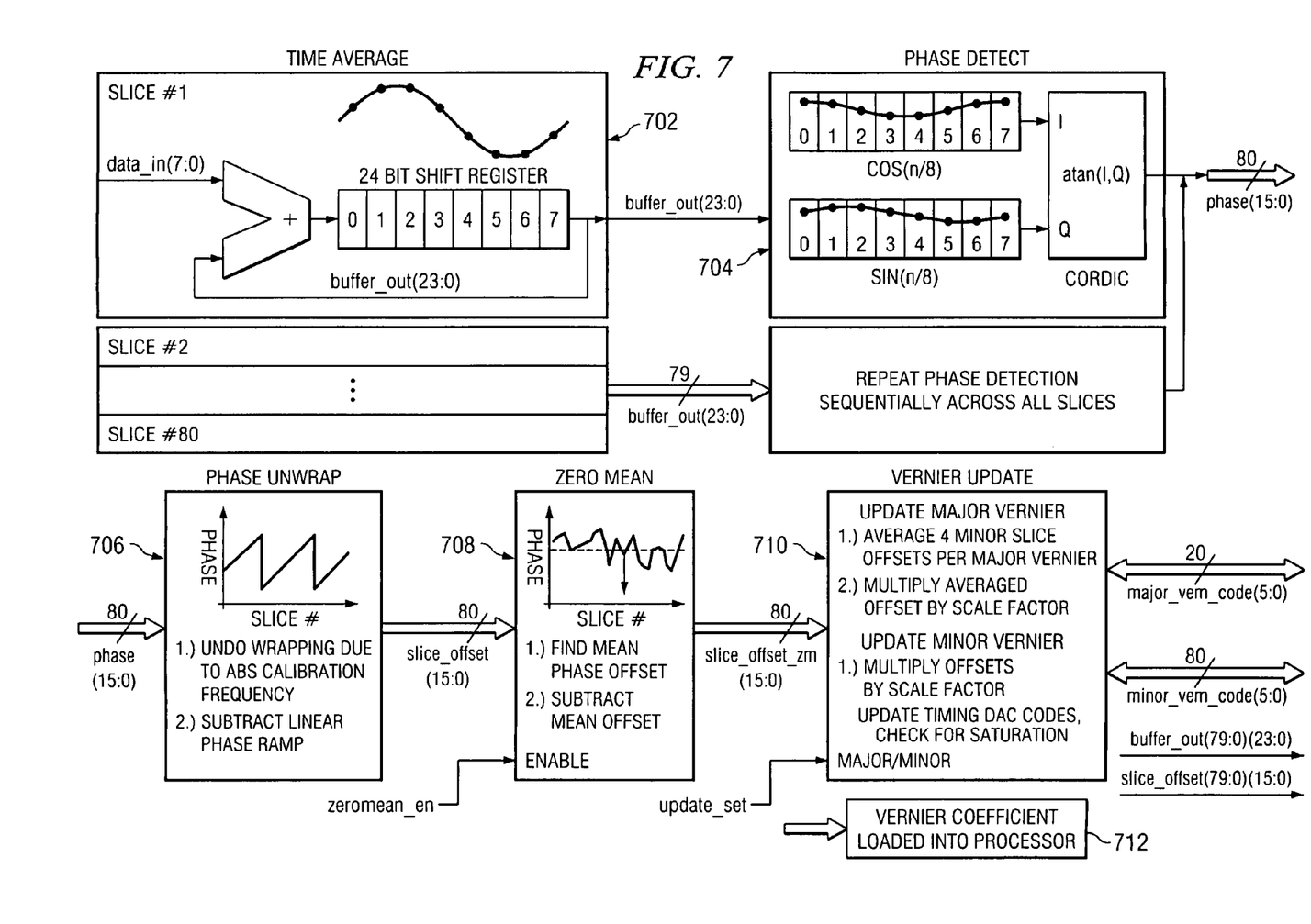
FIG. 7 is a block diagram showing the main steps in a phase coherent timing calibration algorithm according to an embodiment of the present invention.

FIG. 7 is a block diagram showing the main steps in a frequency and phase coherent timing calibration algorithm implemented for the 20 GSa/s interleaved ADC according to an embodiment of the present invention. In process 702, time averaging is performed. This step is performed in hardware, in parallel, on all 80 ADC slices. Time averaging in process 702 relies on a coherent calibration signal source. Such a source is frequency- and phase-locked to the sample clock, and the calibration waveform appears nearly periodic over 8 consecutive samples seen by an individual ADC slice in this embodiment. This 8-point periodic signal is averaged to reduce non-coherent noise sources in the timing measurement, and the averages stored in a 8×24 bit shift register on each slice. The shift register serves as a circular buffer/accumulator for each of the 8 points. One embodiment of the present invention allows for $2^N$ averages of the 8-point periodic signal, where N may take the value of 0 to 16. Therefore each slice may average its 8-point buffer 1 to 65536 times. Both ADC quantization noise and thermal noise may be approximated as white noise. Time averaging provides a 3M dB reduction in the noise floor of the 8-point measurement (for $\sigma_{avg}=\sigma/\sqrt{N}$, $N=2^M$ averages) or up to 48 dB in this embodiment. This noise reduction is essential if only 8 points of sample memory are used to determine timing information.

In this embodiment, time averaging, per slice basis is accordingly represented as $$x_{m,ave}[i] = \frac{\sum_{j=0}^{N-1} x_m[i+8j]}{N}, \quad [11]$$

where $i$ ranges from 0 to 7, and $m$ varies from 0 to 79.

The data coming into each time averaging block is being fed by the output of one of those 80 ADC slices, and is 8-bits wide. As shown in process 702, an adder can be used with 8 shift registers as accumulators. If the calibration signal as seen by the ADC sample slice is a periodic waveform with a period of 8 ADC slice samples, then after capturing 8 samples the 9th sample can be added to the $1^{st}$ sample, and so on. Each register accumulates 1 out of every 8 samples of the calibration waveform.

As discussed above, it is advantageous to introduce cycle slip. If the calibration waveform is locked to the sample clock, then the ADC revisits the same point on the cycle of the periodic waveform each time. If there is an error in the ADC transfer curve at one of those 8 points, then an erroneous measurement can result. However, if the calibration waveform period is slightly offset from the ADC sample clock, then the same point won't be revisited each time. Thus, over the course of the entire acquisition data is sampled from all sections of the ADC transfer curve.

The waveform capture and averaging processes can occur in parallel on all 80 slices (or a single averaging block could be used to successively operate from many ADC slices). Subsequent processes in this example operate on the contents of the 24-bit registers in memory on each of the 80 slices in a sequential fashion. To determine the phase for each of the 80 sample slices, the example includes a waveform correlation block which correlates the accumulated waveform with an in phase and a quadrature component, a sine and a cosine, thereby generating a complex number which represents the phase for each of those 80 slices. Depending on the calibration frequency, the phase values can wrap around at $2\pi$ to 0. Process 706 unwraps the phase of the waveform.

In process 704, phase detection on the slices from time averaging in process 702 is performed. In the preferred embodiment, phase detection, and all subsequent steps are performed sequentially on a slice by slice basis after time averaging in process 702 is complete. These steps may be executed in a dedicated on-chip state machine, a programmable on-chip microcontroller, or externally in certain embodiments. In one embodiment of the present invention, phase detection and subsequent steps will be executed in a dedicated on-chip state machine. Phase detection is performed by correlating the periodically averaged 8-point buffer with a sine and cosine:

$$I_m = \sum_{i=0}^{7} x_{m,avg}[i]\cos\left(\frac{2\pi i}{8}\right), \quad [12]$$

where $m$ represents the ADC slice chosen, $m$ varies from $$Q_m \sum_{i=0}^{7} x_{m,avg}[i]\sin\left(\frac{2\pi i}{8}\right) \text{ 0 to 79.}$$

Notice that for P=8 samples in one period of the calibration waveform, the sine and cosine values are simple:

| Θ | sin θ | cos θ |
|---|---|---|
| 0 | 0 | 1 |
| π/4 | 1/√2 | 1/√2 |
| 2π/4 | 1 | 0 |
| 3π/4 | 1/√2 | −1/√2 |
| π | 0 | −1 |
| 5π/4 | −1/√2 | −1/√2 |
| 6π/4 | −1 | 0 |
| 7π/4 | −1/√2 | 1/√2 |

The in-phase and quadrature components are used to determine phase of the waveform as seen by each ADC slice.

$$\angle X_{m,avg}[1] = \tan^{-1}\left(\frac{Q}{I}\right) \quad [13]$$

The arctan function is computed in hardware in this embodiment through the CORDIC (COordinate Rotation Digital Computer) algorithm. This multiplier-less algorithm converges on the solution by iteratively rotating the I,Q phasor. The algorithm was initially proposed by J. Volder in 1959. It operates as follows:

Find_Phase(X, Y, Phase, N)
{
Do a coarse rotation if required
Do a fine rotation
Iterate fine rotation N times
Accumulate phase rotation in each step
Final Phase is negative of the accumulated phase
} where a 'coarse rotation' is a rotation by +90 degrees if the phase is positive, or −90 degrees if the phase is negative, and a 'fine rotation' is a rotation by + or −atan(K) degrees, where K varies depending on the desired resolution of the phase.

Phase unwrapping and delay removal is performed in process 706. This process computes the per slice sampling clock phase error relative to a reference phase. Phase unwrapping removes the phase ambiguity resulting from the fact that the periodic calibration signal may have a period (when sampled at the full sampling rate of 20 GS/s) that is smaller than, in this example, the 80 samples. In this event, the phase of the calibration waveform as seen by subsequent slices will increase to >2π. Since phase may only be measured within 2π, there is a phase ambiguity in the measurement. The measured calibration phase must be "unwrapped" to remove this phase ambiguity. Since subsequent slices should have a delayed phase corresponding to a delayed sampling time, phase jumps of ~2π in an otherwise decreasing phase slope may be interpreted as phase wrap events and corrected.

The result is a signal that corresponds to time delay, each sampling slice being about 50 picoseconds (ps) delayed from the previous slice. The quantity of interest to be measured is the difference between the measured delay and an ideal delay where each slice is 50 ps away from the previous slice.

To determine the phase error of each sampling clock, the expected delay due to ideal sampling is first removed. In this example, the 50 ps delay between adjacent samples (slices) of the ADC is equivalent to a phase ramp in the frequency domain. In this embodiment, the corrected phase values are computed in [5].

Let $P_m$ represent the unwrapped phase values, $\angle X_{m,avg,unwrapped}[1]$ (where m=0.79), from every slice. Then the phase error value at every slice, m, in radians is:

$$P_{m,err} = P_m + \frac{2\pi f_c m}{f_s} \text{ radians,}$$

where $f_c$ is the calibration frequency and $f_s$ is the aggregate ADC sampling rate.

A code snippet for phase unwrapping and ideal sampling delay removal follows:

```
//   int phasedata [NSLICES];                              //Phase values per slice
void unwrapPhase (int *phasedata, const int maxslices)    {
int I, wraps=0, gap;
/* Phase Unwrapping */
for (i=0; i<(maxslices-1);i++) {
    gap = phasedata [i]-phasedata [i+1]-2*PI*wraps;
    if (gap>0)                                             //Expect only delay, noise not
                                                           //greater than 1 sample (50 ps)
        {wraps++;}
phasedata[i+1]=phasedata[i+1]-2*PI*wraps;
}
phasedata[maxslices-1] = phasedata[maxslices-1]-2*PI*wraps;
/* Remove Delay Ramp */
for (i=0; i<maxslices; i++)
    phasedata[i] = phasedata[i] + 2*PI*FC*1/FS*i;          //Delay in radians of the cal
                                                           //wave from successive ADC
                                                           //samples
}
```

In process 708, the mean phase error is zeroed sequentially on each of the phase error values calculated per slice. In preferred embodiments of the present invention, timing calibration relies only on the relative timing errors between slices. For example, if all slices measured have a 0.5 ps phase error relative to some master clock, then each slice would sample the data 50 ps after the previous slice. Such an ADC would have sampling slices uniformly interleaved in time, regardless of some initial time offset. With this in mind, certain embodiments of the present invention specify that the calculated phase error values should have a zero mean. As a result, all timing vernier adjustments don't drift as a group over time. This allows for relative timing adjustments without danger of exceeding the sampling clock tuning range.

The zero mean phase error process 708 may be represented below as one step of calculating the mean, and a second step of subtracting that value from all slice phases.

$$\overline{p} = \frac{\sum_{m=0}^{79} p_M}{80}$$ [15]

$\hat{P} = P_M = P_M - \overline{P}$, where m represents the ACD slice and ranges from 0 to 79. [16]

At this point in the example, the process has calculated an estimate of the phase error at each of those 80 slices. In certain embodiments, this phase error is then converted into a value that can be used with correction circuits.

Figure 8:
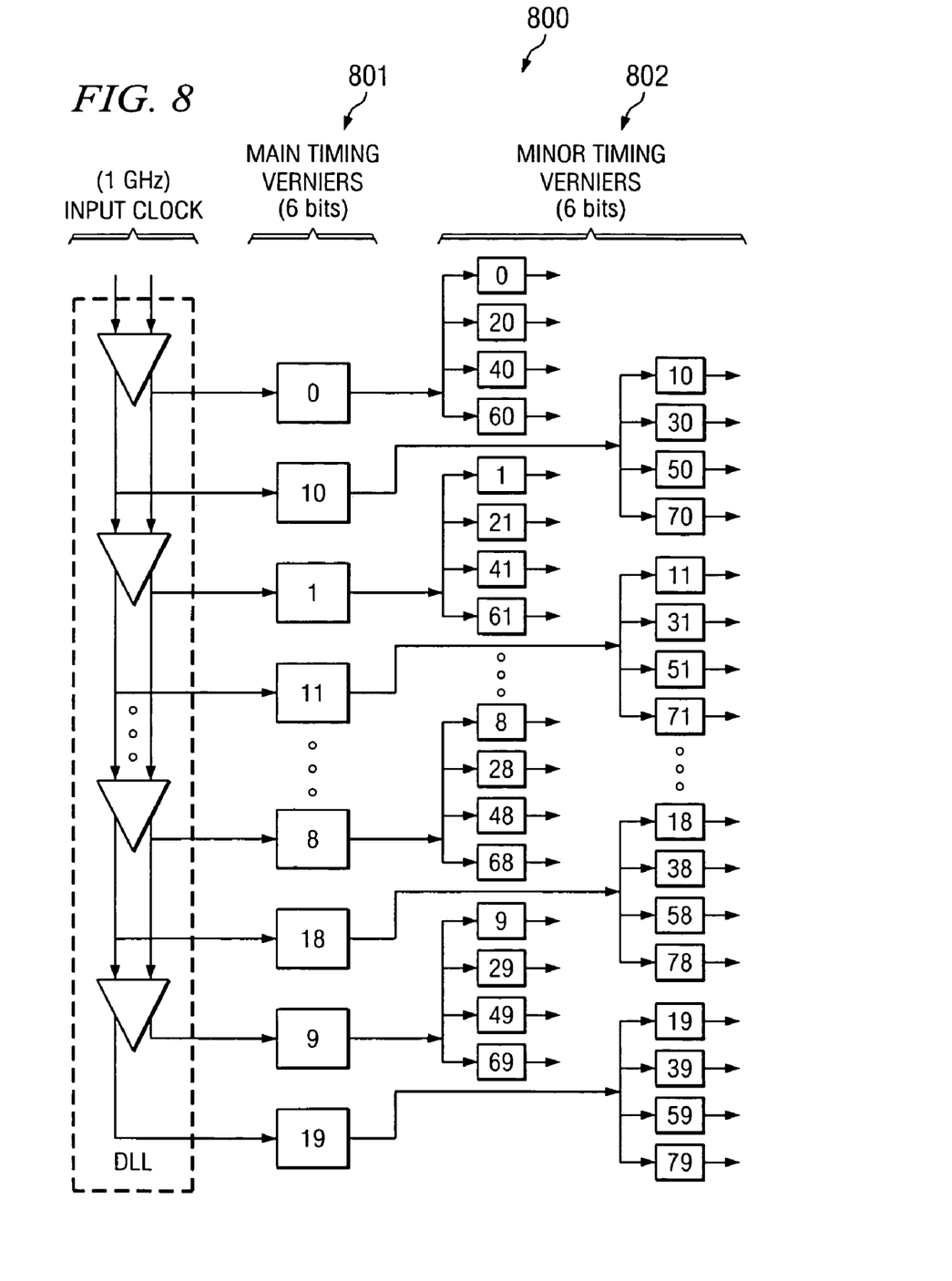
FIG. 8 is an illustration of sampling clock generation and adjustment veniers.

In process 710, vernier update, the phase errors measured at each slice may be easily converted to time offsets. For example, consider that a 1 GHz clock is used to generate 20 separate 1 GHz clocks with equally spaced phases, each ideally 50 ps apart. Each of those 20 clocks is divided by 4 to generate 4 phases of a 250 MHz clock. Those 80 sampling clocks have a period of 250 MHz and are ideally spaced 50 ps apart. For calibration purposes in this example, both the 20 'main' clocks and the 80 'minor' clocks may be adjusted. The timing adjustment for the 20 main clocks is referred to as the major vernier, and that of the 80 minor clocks as the minor vernier. The major vernier adjusts larger inaccuracies in time, and the minor verniers are available for smaller adjustments. FIG. 8 shows the relationship between main and minor verniers available for clock adjustment in this example. Once the error values for the sampling clock at each slice are known, the sampling clock phases are adjusted to compensate. The process is iterative, and once the timing verniers are adjusted, the new state of the sampling clocks is measured until the desired calibration error is achieved. Vernier update 710 is iterative because the timing verniers are nonlinear in this embodiment of the present invention. However, in certain embodiments, timing verniers are linear. In a preferred embodiment, two iterations of adjusting the major verniers followed by 3 minor vernier iterations are adequate. In the timing vernier update stage, only one vernier type is updated at a time. Conversion of phase errors to time errors is not required, and certain embodiments of the present invention do not perform this process. Certain embodiments multiply the phase errors by a constant to yield the necessary timing DAC adjustment in LSBs.

The phase error of the major verniers cannot be measured directly. Instead, an averaged error of the minor verniers derived from the major vernier is used for vernier update 710. For example, the average of slice sampling clocks (0,20,40,60) generates the phase error of major vernier 0 of main timing verniers 801 shown in FIG. 8 illustrating sampling clock generation 800. The minor vernier adjustments using minor timing verniers 802 are performed once major vernier adjustments are complete, and the minor vernier adjustment values are calculated directly from the phase/time errors in the slice sampling clocks in this embodiment. Additional detail regarding sampling clock generation can be found in "Interleaved clock signal generator having serial delay and ring counter architecture," U.S. Patent Publication Number 20030151441, herein incorporated by reference in its entirety.

Returning to FIG. 7, in process 712, vernier coefficients calculated in process 710 are loaded into the ADC. These steps are iterative in certain embodiments, such that the vernier coefficients are calculated by taking one measurement of phase information, and using that measurement to calculate a set of vernier coefficients that are then loaded into the ADC in process 712. These coefficients are then used to take a second measurement, and those coefficients loaded into the ADC, and so on.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for frequency response measurement comprising:
    applying a calibration signal to a time-interleaved sampling device, wherein said signal is coherent with at least one sample clock on said device, is periodic, and has a predetermined spectral content and frequency;
    sampling, by said time-interleaved sampling device, said calibration signal at a plurality of phases to form samples;
    averaging the formed samples over one or more periods of the calibration waveform to form a measurement record for said at least one sample clock; and
    calculating an error of each sample based on said measurement record.

2. The method of claim 1 wherein said error comprises error selected from the group consisting of:
    phase error, magnitude error, and combinations thereof.

3. The method of claim 1 further comprising:
    adjusting at least one sample clock to correct an error of at least one sample.

4. The method of claim 1 wherein said device is selected from the group consisting of:
    analog-to-digital converter (ADC), digital-to-analog converter (DAC), data conversion module, and combinations thereof.

5. The method of claim 1 wherein said calibration signal comprises at least one waveform selected from the group consisting of:
    sinusoids, square waves, and triangle waves.

6. The method of claim 1 wherein said calibration signal comprises a frequency offset for inducing cycle slip.

7. The method of claim 1 further comprising:
adjusting at least one time correction circuit based on the phase error of at least one measurement.

8. The method of claim 1 further comprising:
applying a calibration signal to a plurality of time-interleaved sampling devices.

9. The method of claim 1 wherein said sampling comprises digital filtering to effect correction of the formed samples.

10. An apparatus comprising:
means for sampling a calibration signal to form samples comprising a time-interleaved sampling device with at least one sample clock;
means for applying a calibration signal wherein said signal is coherent with at least one sample clock on said device, is periodic, and has a predetermined spectral content and frequency;
means for averaging formed samples over one or more periods of the calibration signal to form a measurement record; and
means for calculating an error of each formed sample based on a measurement record.

11. The method of claim 10 wherein said error comprises error selected from the group consisting of:
phase error, magnitude error, and combinations thereof.

12. The apparatus of claim 10 further comprising:
means for adjusting at least one sample clock to correct an error of at least one sample.

13. The apparatus of claim 10 wherein said means for sampling is selected from the group consisting of:
analog-to-digital converter (ADC), digital-to-analog converter (DAC), data conversion module, and combinations thereof.

14. The apparatus of claim 10 wherein said calibration signal comprises at least one waveform selected from the group consisting of:
sinusoids, square waves, and triangle waves.

15. The apparatus of claim 10 wherein said means for applying applies a calibration signal comprising a frequency offset for inducing cycle slip.

16. The apparatus of claim 10 further comprising:
means for adjusting at least one time correction circuit based on the phase error of at least one measurement.

17. The apparatus of claim 10 further comprising:
means for correcting a formed sample using digital filtering based on the frequency response of at least one measurement record.

18. The apparatus of claim 10 further comprising:
means for applying a calibration signal to a plurality of time-interleaved sampling devices.

19. A time-interleaved sampling device comprising:
at least one sample clock;
a plurality of time-interleaved sampling components operable to form sampling slices from a received calibration signal, wherein said signal is coherent with at least one sample clock signal on said device and is periodic;
a timing controller for adjusting the timing of at least one sample clock signal based on the phase error of at least one formed sampling slice;
a register for averaging sampling slices; and
one or more data collection buffers for storing averaged sampling slices.

20. The time-interleaved sampling device of claim 19, wherein said timing controller comprises:
a plurality of vernier circuits for adjusting the sample clock signal according to each sampling slice.

21. The time-interleaved sampling device of claim 19, wherein said timing controller comprises:
a digital filter to adjust the magnitude and phase of said sample clock signal according to each sampling slice.

22. The time-interleaved sampling device of claim 19 wherein the device comprises a plurality of components selected from the group consisting of:
analog-to-digital converter (ADC), digital-to-analog converter (DAC), data conversion module, and combinations thereof.

* * * * *